PURELY ELECTRONIC AUTOMATIC GAIN CONTROL FOR AN AUDIO AMPLIFIER

Filed Sept. 15, 1967 2 Sheets-Sheet 1

PURELY ELECTRONIC AUTOMATIC GAIN CONTROL FOR AN AUDIO AMPLIFIER

Filed Sept. 15, 1967 2 Sheets-Sheet 2

3,519,948

PURELY ELECTRONIC AUTOMATIC GAIN CONTROL FOR AN AUDIO AMPLIFIER

Henri Matthey, La Chaux-de-Fonds, and Jean J. Bessire, Bienne, Switzerland, assignors to Eresa S.A., Bienne, Switzerland, a corporation of Switzerland Filed Sept. 15, 1967, Ser. No. 668,139
Claims priority, application Switzerland, Sept. 29, 1966, 14,088/66
Int. Cl. H03g *3/22*
U.S. Cl. 330—145 7 Claims

ABSTRACT OF THE DISCLOSURE

The invention concerns a purely electronic automatic gain control for an audio amplifier comprising an integrating circuit determining the time constant for the gain to return to its nominal value after an overload, said time constant being proportional to the time integral of the part of the input signal laying above its nominal value.

The present invention concerns the automatic control of the gain of an audio amplifier. Numerous solutions have already been proposed until now, for example by limiting the gain of such an amplifier by means of a limiter or of a dynamic compressor.

However, these devices do not give satisfaction mainly due to the fact that after a compression or a limitation of the gain, coming back to the normal gain is too quickly effected. This is particularly true in the case where the signals to be transmitted come from the superimposition of a strong noise which is inhomogenous and of an interview which one desires to realize. In fact, in this case, the high signals of the background noise reduces the gain and the conversation which one desires to transmit becomes inaudible. If this is frequently repeated, the annoying phenomena of pumping results.

To avoid these abrupt variation phenomena of the output level of the amplifier, as well as to avoid the pumping phenomena, it has been proposed to increase the time necessary to come back to the normal gain and to render this return time proportional to the duration during which the input signal of the amplifier is raised above a prescribed maximum. However, the only realizations of this solution now existing use an optical timer which obviously is strongly subject to rapid aging and presents, due to the incandescence lamp used, an annoying inertia.

The present invention has for its object an automatic control device for the gain of audio amplifiers, characterized by the fact that it comprises a purely electronic control device comprising an integrating circuit defining the time constant of the return of the gain to its nominal value, and by the fact that this time constant is proportional to the time integral of the part of the input signal over a predetermined nominal value.

The attached drawing shows schematically and by way of example one embodiment of the present invention wherein.

Figure 1:
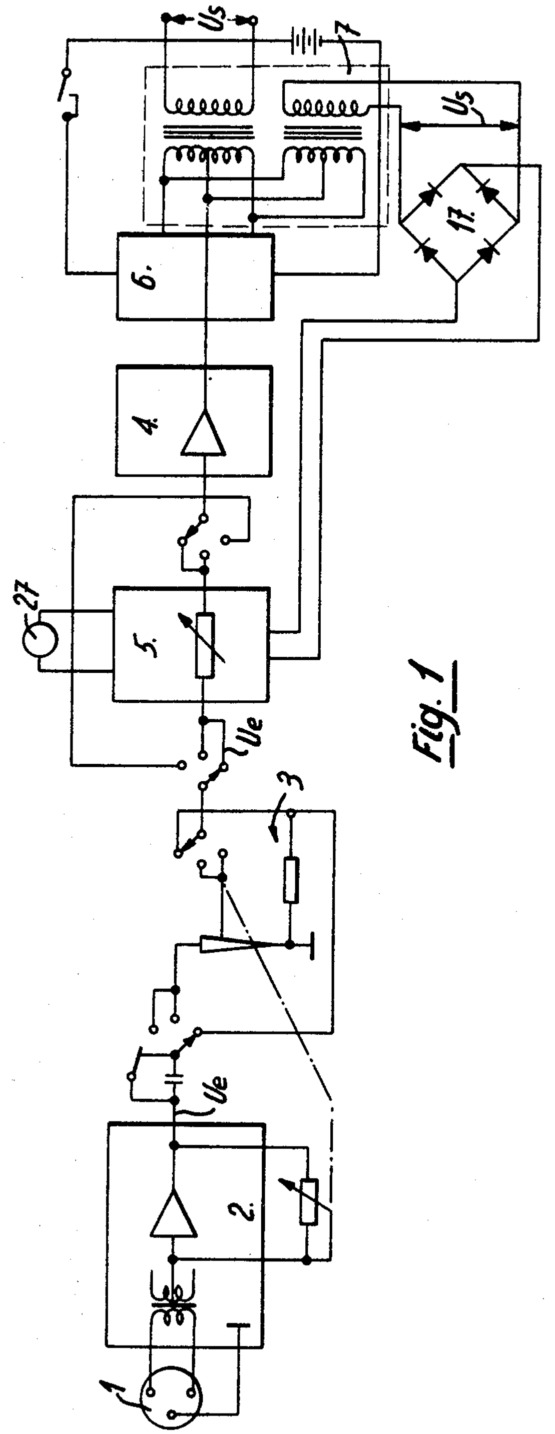
FIG. 1 shows a schematic diagram of an audio amplifier chain provided with an automatic gain control according to the invention.

The audio amplification chain shown in the schematic diagram of FIG. 1 comprises a microphone 1 connected to a first preamplifier 2 the output of which feeds through a commutation device 3 to either a second preamplifier 4, or a gain adjusting device 5 the output of which feeds to this second preamplifier 4. In the example shown, this commutation device 3 provides a choice between three working modes of the amplification chain, either:

(a) with fixed compression and limitation gain characteristics which are determined;

(b) with manually adjustable compression and limitation gain characteristics; and (c) with automatic adjustment of the compression and limitation gain characteristics. Only this third working mode is of interest here and only this one will thus be described herebelow. The working mode with automatic gain adjustment corresponds to the position shown of the different selectors in FIG. 1.

The output of the second preamplifier 4 feeds an output stage formed by a power amplifier 6, the output transformer 7 of which has been shown in more detail for the sake of understanding the description which will follow.

Only the automatic gain adjustment device and its control device are the object of the present invention, so the other elements which are classical of this amplification chain, given here briefly to facilitate the understanding, will not be described in more detail.

In the following, the input signal U*e* corresponds to the signal delivered by the first preamplifier 2 and the signal U*s* corresponds to the signal delivered by the power amplifier 6.

Figure 2:
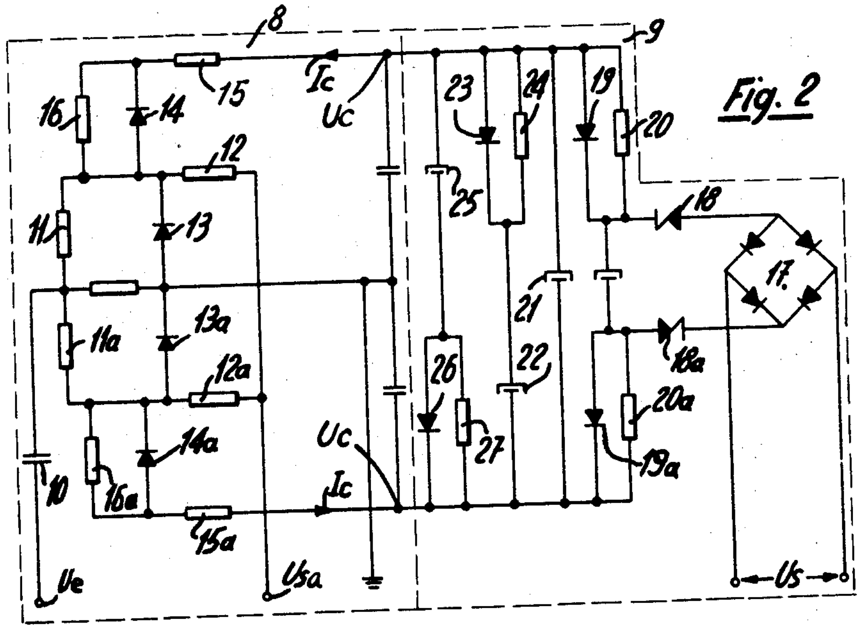
FIG. 2 is a detailed scheme of the automatic gain regulating device and of its control device.

The automatic gain regulating device 5 shown in detail in FIG. 2 works in the example shown both as a dynamic compressor and as a limiter and comprises a voltage divider 8 and a control device 9 determining in response to the output signal U*s*, and thus also in response to the input signal U*e*, the working mode of this voltage divider.

To avoid any parasitic voltages in the output signal U*s*, this voltage divider is made symmetrical as shown in FIG. 2. This symmetrical voltage divider comprises an input capacitor 10 and two resistor groups comprising series connected resistors 11 and 12 and series connected resistors **11*a* and 12*a***; the two resistor groups are connected in parallel at the junction at which the voltage U*sa* is taken, and fed to the input of the power amplifier 6. This voltage divider comprises further two diodes 13, **13*a*, connected in parallel with the resistors 11, 12 and 11*a*, 12*a*. Diodes 13 and 13*a*** are biased so that they conduct maximum level to which the input signal U*e* has to be limited. The midpoint between the diodes 13, **13*a* is connected on the one hand through a high resistor to the midpoint between the resistors 11, 11*a***, the same point of the divider at which the input signal U*e* is applied, and on the other hand to a ground or reference potential point.

This voltage divider comprises further two resistors 15, **15*a* and two diodes 14, 14*a* connected respectively in series with the diodes 13, 13*a*. These diodes 14, 14*a* are biased by a shunt resistor 16, 16*a*** respectively.

The automatic gain regulating device comprises further a control device 9 DC coupled and parallel connected to the voltage divider 8 comprising a DC current source and an integrating device.

The DC current source is constituted by a rectifier 17 fed by a secondary of the output transformer 7. This rectifier bridge 17 delivers thus a continuous voltage proportional to the output signal U*s*. Zener diodes 18, **18*a*** fix a reference voltage corresponding to the start of the compression of the input signal U*e*, so that the control voltage U*c* of the dynamic voltage divider is constituted by the difference between the rectified DC voltage and the reference voltage determined by the Zener diodes 18, **18*a*. As can be seen in FIG. 2, the control device 9 is symmetrical like the voltage divider 8. The Zener diodes 18, 18a are connected through diodes 19, 19a, the latter being shunted by resistors 20, 20a, to the resistors 15, 15a, respectively. In this way, the DC current source is connected in parallel with the dynamic voltage divider 8. As will be seen later on, this DC current source enables modification of the state of the dynamic voltage divider 8** and causes thus a variation of the ratio of the voltages U*e* and U*sa* at the input and of the output of this divider, thus modifying the gain of the amplifier chain.

The integrator device of the control device 9 enables the maintenance of the working conditions of the dynamic divider created by a control voltage U*c* during a certain time after the disappearance of this control voltage or at least the slow down of the return to normal working conditions of the divider after the disappearing of the control voltage U*c*.

This integrator device comprises a first capacitor 21 presenting for example a time constant of the order of 60 ms. A second capacitor 22 is connected in series with a discharge diode 23 and a charging resistor 24, and its value is chosen so that the total time constant of the two capacitors 21, 22 is in the range for example, between 0.4 and 2.5 s. At least, this integrator circuit comprises further a third capacitor 25 connected in series with a discharge diode 26 and a charging resistor 27; and its value is such that the total time constant of the three capacitors 21, 22 and 25 is of the order of 3 to 7 seconds. As can be seen in FIG. 2, this integrator device is connected in parallel with the DC current source and enables the temporary storage of a part of the energy delivered by this DC source.

Figure 3:
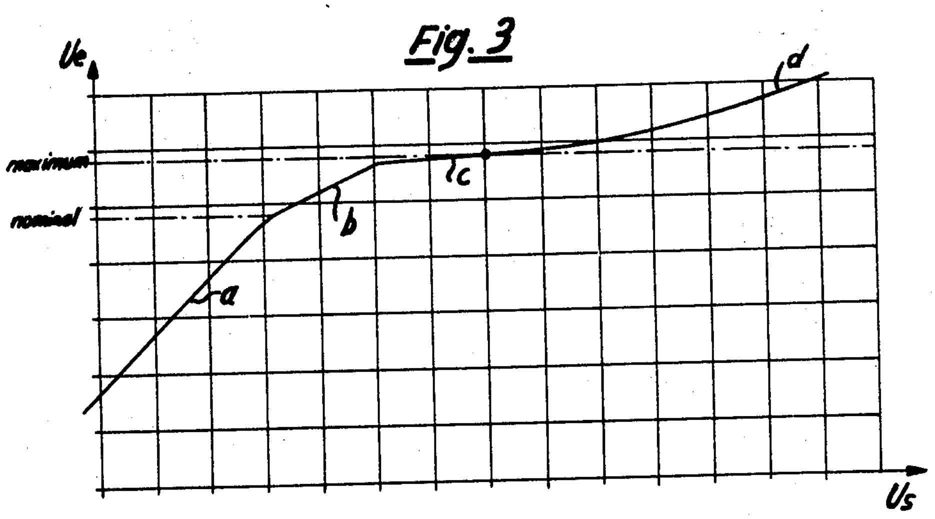
FIG. 3 shows schematically the shape of the output signal of the amplifier chain as a function of its input signal.

The working of the automatic gain regulating device described is the following:

(a) In a first phase, the input signal U*e* is lower or at most equal to its nominal value. In these conditions, the rectified output voltage U*s* is not sufficient to cause the unblocking of the Zener diodes 18, 18a, and the control tension U*c* is nought so that all the diodes of the automatic gain regulating device are blocked. In this first working phase, the signal U*sa* is equal to the input signal U*e* and the output signal U*s* is directly proportional to the input signal U*e*. This is plotted graphically in FIG. 3 by means of the straight line portion *a*.

(b) In a second working phase, the input signal U*e* is greater than its nominal level but lower than its maximum level. In these conditions, the rectified output signal U*s* is sufficient to make the Zener diodes 18, 18a conduct so that a control current is fed through the resistors 20, 20a; 15, 15a; 16, 16a and 11, 11a. When this current increases, the diodes 19, 19a become conducting, then the diodes 14, 14a also become conducting. The reason for which the resistors 20, 20a and the diodes 19, 19a are utilized is to slow down the establishment of the control current I*c* in order to obtain a more supple and less abrupt control.

As soon as the diodes 14, 14a conduct, the input signal U*e* is no longer integrally found in U*sa*, but it is diminished, in a sort divided in the ratio of the resistors 15, 15a to 12, 12a in first approximation at least.

In the second working phase, between the maximum and nominal levels of the input signal U*e*, the signal U*sa* feeding the power amplifier is equal to a fractional part of the input signal U*e*.

During this second working phase, the output signal U*s* is linearly proportional to the input signal U*e*, but however, it increases less rapidly in relation to U*e* than during the first working phase. This second working phase is illustrated by the straight line portion *b* in FIG. 3. This second phase is a compression phase.

(c) The third working phase corresponds to when the input signal U*e* is higher than its maximum level but during which the diodes 13, 13a are not saturated.

When the input signal U*e* reaches its maximum level, the rectified output signal causes a control current I*c* sufficient to render the diodes 13, 13a conducting. From that moment, the input signal U*e* is practically cancelled and an equilibrium is reached for which the input signal is maintained at approximately its maximum level.

During this working phase, the output signal U*s* does not depend theoretically anymore on the input signal, but is limited to a constant value. However, due to the fact that the diodes 13, 13a have a low but existing internal resistance, the output voltage U*s* depends in practice still on the input signal U*e*. This third working phase is shown by the straight line portion *c* in FIG. 3, the slope of which is practically nought, and much less in any case than the one of the straight line portions *a* and *b* of the two first phases. This third phase is a limitation phase.

(d) Finally, in a fourth phase of the working, the input signal is much higher than its maximum level, and the diodes 13, 13a are saturated.

Due to the fact that the internal resistor of a diode does not linearly diminish with the conduction current, but according to a hyperbolic function, the output signal increases again more rapidly in function of the input signal U*e* when the diode is saturated.

This fourth phase of the working thus corresponds to a very high compression but enables, however, the output signal U*s* to increase in function of the input signal U*e*. This is shown by the curve portion *d* in FIG. 3.

It is to be noted that when the automatic gain regulating device is used in an emitter installation, this forth phase of the working may be suppressed. This is in fact important in this particular application in order not to overload the emitter. In this case it suffices to choose the diodes 13, 13a of which the saturation current is located above the one produced by the greatest possible input signal U*e*.

The influence of the integrator device on the automatic gain regulation is to differ the return to the normal gain after a gain reduction. This is obtained simply by the loading of the capacitors 21, 22 and 25 by the control current I*c*. In fact, as soon as the current I*c* disappears, that is to say when the rectified output voltage is no longer sufficient to render the Zener diodes 18, 18a conducting, these capacitors unload and give rise to a pseudo control current corresponding to the exponential discharge of the total capacity of this integrator circuit. This pseudo control current maintains the state of the dynamic voltage divider and delays its return to its normal working once the control current I*c* has disappeared.

It is to be noted that the time constant with which the dynamic divider recovers to its normal state, that is to say the time in which the normal gain is restored, depends on the amplitude, on the shape and on the duration of the control current; in fact, this time constant depends on the time integral of the part of the input signal U*e* over its nominal value.

According to the chosen values of the capacity, one may delay the return to the normal gain until several seconds.

This is particularly important since one renders the gain variations resulting from the automatic regulation of the gain practically inaudible to the ear, which, until now, was not possible. This enables further to eliminate all the pumping effects due to abrupt gain variations.

It will be noted that with the described device, the gain undergoes a nearly instantaneous variation for a very short and isolated overcoming of the nominal level of the input signal U*e*, and does not hinder the audio output, but that, on the contrary, either for a repetition of brief overcomings, or for an overcoming of long duration of this nominal level, the gain undergoes a practically constant reduction.

This latter phenomena is particularly appreciated during the processing of input signals corresponding to an interview in workshops or in all other places where ambient noises are strong and repeated. In fact, instead of producing a pumping of the gain as in the known devices, the described device reduces the gain at a practically constant value and the interview can be superimposed on the ambient noises without difficulty.

One embodiment has been described by various examples but it is evident that the integrator circuit described could be used with other automatic gain regulating devices. As shown in FIG. 1, an indicator 27 of the compression ratio can be added. This indicator is a measuring apparatus for the control current $I_c$.

We claim:

1. A control device for regulating the amplitude of signals in the audio frequency range, said device comprising an audio signal amplitude control circuit constructed and arranged to reduce the amplitude of audio signals passing therethrough in accordance with the value of applied control signals, a control signal generating circuit arranged to apply control signals to said audio signal amplitude control circuit, said control signal generating circuit including rectifier means for detecting the magnitude of said audio signals, overload breakdown means connected to receive outputs from said rectifier means, said overload breakdown means being operative to prevent the passage of said outputs until they have exceeded a predetermined magnitude, and a time constant circuit having a predetermined discharge time constant, said time constant circuit being connected between said overload breakdown means and said audio signal amplitude control circuit for supplying control signals to said control circuit in accordance with outputs from said overload breakdown means, said time constant circuit having means for permitting immediate application of increasing outputs from said overload breakdown means as control signals to said audio signal control circuit, said last mentioned means providing slow discharge of said time constant circuit upon decrease of the output from said overload breakdown means.

2. A control device according to claim 1 wherein said audio signal amplitude control circuit includes an audio signal flow path, and an active voltage divider circuit connected to said signal flow path for shunting a portion of the signals passing along said flow path, and wherein said control signal generating circuit is constructed to produce control voltages applied to control the voltage divider ratio.

3. A control device according to claim 2 wherein said active voltage divider circuit includes diodes arranged to shunt selected portions of the signals from said flow path and including connections applying said control voltage to control the bias on said diodes.

4. A control device according to claim 1 wherein said time constant circuit is an integrator circuit connected in parallel with the output of said overload breakdown means.

5. A control device according to claim 1 wherein said time constant circuit includes a plurality of parallel connected capacitors.

6. A control device according to claim 1 wherein said time constant circuit includes at least one resistor and a diode connected in parallel with each other, and a capacitor connected in series with said resistor and diode, thereby to provide rapid charging and slower discharging of said time constant circuit.

7. A control device according to claim 1 wherein said audio signal amplitude control circuit includes an audio signal flow path and plural groups of circuit elements arranged for controlled attenuation of signals of opposite polarities passing along said flow path.

References Cited

UNITED STATES PATENTS

| | | | |
|---|---|---|---|
| 2,135,953 | 11/1938 | Weber | 330—138 X |
| 2,824,179 | 2/1958 | Tilley | 330—145 |
| 2,946,017 | 7/1960 | Murphree | 330—140 X |
| 3,109,989 | 1/1963 | Muir | 330—140 X |
| 3,243,919 | 3/1966 | Scaroni | 330—145 X |
| 3,351,861 | 11/1967 | Martin et al. | 330—140 X |

FOREIGN PATENTS

| | | |
|---|---|---|
| 604,499 | 7/1948 | Great Britain. |

ROY LAKE, Primary Examiner

J. B. MULLINS, Assistant Examiner

U.S. Cl. X.R.

330—138, 141